(12) United States Patent
Gardner et al.

(10) Patent No.: US 10,483,249 B2
(45) Date of Patent: Nov. 19, 2019

(54) INTEGRATED PASSIVE DEVICES ON CHIP

(71) Applicant: Intel Corporation, Santa Clara, CA (US)

(72) Inventors: Donald S. Gardner, Los Altos, CA (US); Edward A. Burton, Hillsboro, OR (US); Gerhard Schrom, Gales Creek, OR (US); Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/060,658

(22) PCT Filed: Dec. 26, 2015

(86) PCT No.: PCT/US2015/000458
§ 371 (c)(1),
(2) Date: Jun. 8, 2018

(87) PCT Pub. No.: WO2017/111861
PCT Pub. Date: Jun. 29, 2017

(65) Prior Publication Data
US 2019/0006334 A1 Jan. 3, 2019

(51) Int. Cl.
*H01L 25/16* (2006.01)
*H01L 25/07* (2006.01)
*H01L 23/498* (2006.01)
*H01L 23/00* (2006.01)
*H01L 49/02* (2006.01)
*H01L 21/50* (2006.01)
*H01L 29/20* (2006.01)

(52) U.S. Cl.
CPC ............... *H01L 25/16* (2013.01); *H01L 21/50* (2013.01); *H01L 23/49816* (2013.01); *H01L 24/16* (2013.01); *H01L 25/07* (2013.01); *H01L 28/10* (2013.01); *H01L 28/40* (2013.01); *H01L 28/87* (2013.01); *H01L 28/91* (2013.01); *H01L 29/2003* (2013.01); *H01L 2224/16225* (2013.01)

(58) Field of Classification Search
CPC ...................................... H01L 25/16
See application file for complete search history.

(56) References Cited

U.S. PATENT DOCUMENTS

2006/0267159 A1  11/2006  Yamamoto et al.
2010/0265682 A1*  10/2010  Martinez ........... H01L 23/49816
                                                        361/782

(Continued)

OTHER PUBLICATIONS

International Search Report and Written Opinion for International Patent Application No. PCT/US2015/000458 dated Sep. 26, 2016, 14 pgs.

(Continued)

*Primary Examiner* — William A Harriston
(74) *Attorney, Agent, or Firm* — Schwabe, Williamson & Wyatt P.C.

(57) ABSTRACT

Embodiments are generally directed to integrated passive devices on chip. An embodiment of a device includes a semiconductor die; a semiconductor die package, a first side of the package being coupled with the semiconductor die; and one or more separate dies to provide passive components for operation of the semiconductor die, wherein the passive components for operation of the semiconductor die includes inductors.

24 Claims, 10 Drawing Sheets

(56) References Cited

U.S. PATENT DOCUMENTS

| | | |
|---|---|---|
| 2011/0079917 A1 | 4/2011 | Xia et al. |
| 2011/0317387 A1 | 12/2011 | Pan et al. |
| 2014/0091473 A1 | 4/2014 | Len et al. |
| 2014/0264732 A1 | 9/2014 | Elsherbini et al. |

OTHER PUBLICATIONS

International Preliminary Report on Patentablity for International Patent Application No. PCT/US2015/000458, dated Jul. 5, 2018, 11 pages.

* cited by examiner

INTEGRATED PASSIVE DEVICES ON CHIP

CROSS-REFERENCE TO RELATED APPLICATION

This patent application is a U.S. National Phase Application under 35 U.S.C. § 371 of International Application No. PCT/US2015/000458, filed Dec. 26, 2015, entitled "INTEGRATED PASSIVE DEVICES ON CHIP," which designates the United States of America, the entire disclosure of which is hereby incorporated by reference in its entirety and for all purposes.

TECHNICAL FIELD

Embodiments described herein generally relate to the field of electronic devices and, more particularly, to integrated passive devices on chip.

BACKGROUND

The need for scalable integrated passive devices (such as capacitors and inductors) for uses such as near-load, on-chip power delivery is increasing with each subsequent microprocessor technology generation. The need for scalable integrated passive devices is also important for RF (radio frequency) power amplifiers and other similar devices.

Conventional approaches for providing needed passive devices include the use of large and thick air-core inductors and large decoupling capacitors that compete for space with other components. Unfortunately, this competition for space can result in, for example, microprocessor chip designs that have insufficient decoupling capacitance on the input voltage Vcc, thereby resulting in requirements for higher voltages and power consumption as well as reduced clock frequencies and associated performance.

In addition, the maximum-electrical current is not scaling with area for each generation of microprocessor chips, resulting in an expected need for even greater capacitance density in the future.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
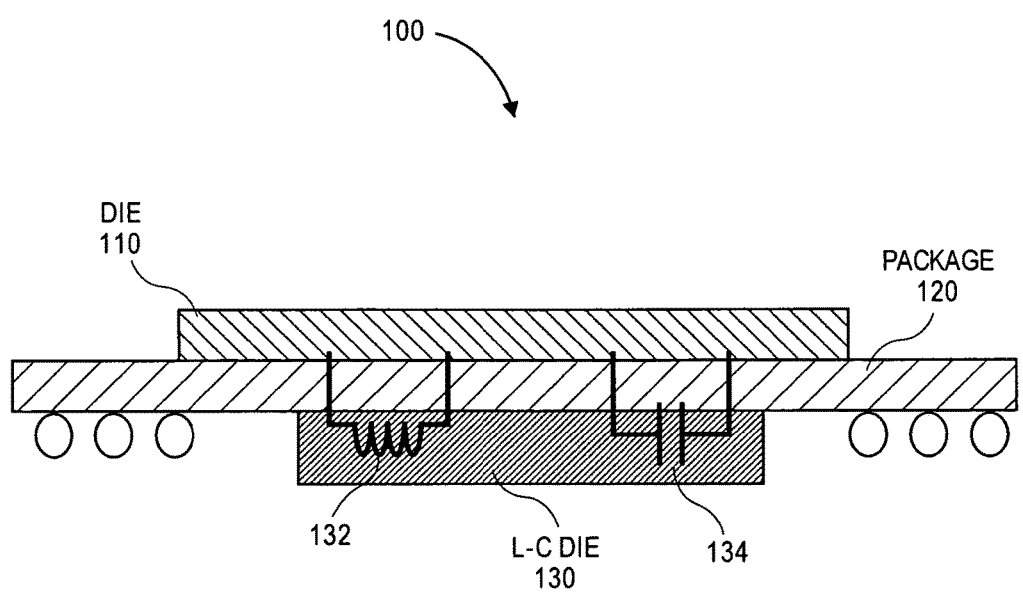
FIG. 1 is an illustration of an apparatus including a separate silicon die for passive components according to an embodiment.

Embodiments described herein are generally directed to integrated passive devices on chip.

For the purposes of this description, the follow definitions are to apply:

"Passive device" or "passive component" means an electrical component that does not require a source of energy for operation. Passive devices include, but are not limited to, capacitors, inductors, resistors, and diodes.

"System on chip" or "SoC" is a chip or integrated circuit (IC) that includes all or most components of a system, including, for example, all or most components of a computer.

"Porous material" means a material having pores with diameters of a certain size. For example, a porous material may include materials with 30-200 nm pore diameters.

In some embodiments, an apparatus, system, or process provides for integrated passive devices on chip connected with a semiconductor die, such as a system on chip. In some embodiments, an apparatus, system, or process provides for inclusion of one or more separate dies, such as a silicon die, with multiple capacitor and inductor structures, wherein the die may be positioned near the load contained in the semiconductor die for support of the operation of the semiconductor die. In some embodiments, the die may further include high voltage transistors to remove such elements from the system on chip. In some embodiments, the one or more separate dies can provide decoupling capacitance and bulk capacitance for a circuit.

In addition to other challenges in providing sufficient capacitance and inductance, the area under processor cores that is available for passive devices is decreasing with decreasing processor core size, which results in lower quality factors for the air-core inductors and less space for capacitors. In the future, to improve total converter efficiency and reduce total bill of materials (BOM) costs and board area, it is desirable to use voltage converters with fewer stages and convert higher voltages such as those from batteries or system power supplies.

Conventional technologies exist to integrate a voltage convertor into an integrated circuit in the form of power management integrated circuits (PMIC), which are integrated circuits for managing power requirements of a host system. In a conventional design for server chips and similar devices, in order to regulate voltage, filter undesired noise, and reduce ripple for power delivery, ceramic decoupling capacitors and large air-core inductors are formed in the package beneath the processor cores, and used together with on-die MIM (Metal Insulator Metal) capacitors. However, air-core inductors will generally require most of the area under the processor cores, which thus results in a limited number of vertical connection, u Vias (Micro Vias) and PTHs (Plated Through Holes), to connect capacitors to the power distribution circuits for input voltage Vccin. The competition for space can result in server chip designs that have insufficient decoupling capacitance on the input voltage Vccin, in turn resulting in reduced clock frequencies and associated performance costs to avoid violating minimum output voltage, Vmin, design requirements.

In some embodiments, limitations on providing sufficient inductance and capacitance for a semiconductor die, including a system on chip (SoC), are addressed by the inclusion of passive components (capacitors and inductors) in one or more separate dies (generally referred to herein as LC dies) that are electrically connected with the semiconductor die. The specific structure of the one or more LC dies and the resulting apparatus varies based on certain factors, including the type of semiconductor die, the amount of power consumed by the apparatus or system, and the implementation of the apparatus or system.

In some embodiments, the one or more separate LC dies are coupled to a die package on an opposite side of the package as the semiconductor die, and being electrically connected with the semiconductor die through the package. In some embodiments, the one or more separate LC dies are further located between the package and a motherboard, where the one or more separate LC dies may include contacts on both the package side and motherboard side of the separate LC dies. In this manner, the one or more LC dies are capable of providing significant inductance and capacitance in a limited space between the package and the platform motherboard. In an alternative embodiment, an interposer is located between the semiconductor die and the package, and is embedded in the package, wherein the interposer includes the passive components for operation of the die.

In some embodiments, the one or more separate LC dies further include one or more high voltage power transistors (including, but not limited to, gallium nitride (GaN) transistors or silicon transistors with thick gate dielectrics), thereby further removing the high voltage power transistors from the semiconductor die, thus allowing for the fabrication of the semiconductor die without requiring allowance for high voltage operation within such die.

In some embodiments, the components in the one or more separate LC dies are located to be near to the loads. The structure of the one or more LC dies and the coupling of the one or more LC dies allow for short distances to the one or more loads of the semiconductor die. The positioning of the capacitors close to the load allows for increase performance because any wiring to reach the capacitors introduces more inductance and reduces effectiveness of the capacitors.

In some embodiments, the one or more separate dies utilizes passive device structures that allow for sufficient capacitance and inductance in the one or more separate die or dies within the limited space provided. In some embodiments, the one or more LC dies include MIM (Metal Insulator Metal) capacitors. In some embodiments, the one or more LC dies combine these capacitors and three dimensional (3D) capacitors with inductors and high voltage transistors, on a die, and position the LC die close to the circuit needing the power.

In some embodiments, the passive devices of the one or more LC dies include 3D passive devices, such as devices implemented in porous materials. In some embodiments, the pores of the porous materials are utilized to form capacitors, the diameters of the pores being of a size (such as 30 nm) to allow placement of metal and insulator into the pores. In some embodiments, the porous materials include, but are not limited to, porous silicon. In some embodiments, the porous capacitors are formed on a back side of the one or more LC dies, such that such capacitors are close to the load but are not on a same side of the one or more LC dies as the inductor and transistor elements. Other technologies for the fabrication of 3D capacitors into the LC dies include corrugated capacitor cells.

In some embodiments, the fabrication of the one or more LC dies includes scaffolding to produce the structure for the fabrication of passive components, wherein the scaffolding process is utilized to form a structure with a high surface area (measuring a ratio of the surface area to the volume of the die).

In some embodiments, planar Metal Insulator Metal (MIM) structures that are being embedded on-die or MOS capacitors are being etched into chip areas that do not have transistors, for example, use of integrated on-die trench capacitors are expensive because they are fabricated on the main processor die.

FIG. 1 is an illustration of an apparatus including a separate silicon die for passive components according to an embodiment. FIG. 1 is intended as a high level figure, and is not intended to illustrate all elements of an apparatus or system. In some embodiments, an apparatus 100 includes a semiconductor die 110 (such as a system on chip) coupled with a package 120. The semiconductor die 110 may also be referred to herein as a main die. In some embodiments, one or more separate dies 130, referred to herein as LC dies, includes multiple capacitor and inductor structures, illustrated in FIG. 1 as one or more capacitors (C) 134 and one or more inductors (L) 132 that can be positioned near to the load. However, FIG. 1 does not illustrate the structure of the inductors and capacitors in the one or more separate LC dies 130.

In some embodiments, the LC die 130 optionally includes one or more transistors (which are not illustrated in FIG. 1), wherein the transistors may be high voltage transistors, thereby removing the high voltage operation of such transistors from the semiconductor die. In some embodiments, the capacitors 134 and inductors 132 include one or more direct paths between the die 110 to the capacitors 134 and inductors 132 of the apparatus 100.

In this manner, the apparatus 100 is capable of providing needed capacitance and inductance for operation without requiring usage of the limited area of the semiconductor die 110 for the formation of capacitor and inductor devices. Further, in the placement of the LC die coupled with the package 120 there is a reduced distance between the passive components and the load, thus reducing the inductance of the lines that would otherwise counteract the capacitance.

In alternative embodiments, the structure of the apparatus 100 may vary. In one embodiment, an interposer between the semiconductor 110 die and the package 120 is embedded in the package, wherein the interposer includes the passive components for operation of the die 110. In one embodiment, the LC die can be embedded inside the interposer to further reduce the inductance between the capacitor 134 and the semiconductor die 110. In one embodiment, the inductors and capacitors may in fabricated in a first chip (or chips) and the high voltage transistors may be fabricated in a separate second chip (of chips), with each of such chips being embedded them in the package 120. In one embodiment, the LC die can be embedded inside the package substrate 120 to further reduce the inductance between the capacitor 134 and the semiconductor die 110.

In a particular embodiment, one or more different integrated capacitor structures, such as metal-insulator-metal (MIM) capacitors, 3D capacitors made in porous material (such as porous silicon, porous alumina, or porous polyimide), trench capacitors, or corrugated capacitors, together with inductors (with or without magnetic material), high-voltage transistors, or both, are combined onto one substrate, referred to herein as the LC die. In such embodiment, the single substrate is located near to the load, which may include, for example, the microprocessor cores and graphics circuits. An apparatus including such structure may be as illustrated in, for example, FIG. 2. In some embodiments, the placement of the LC substrate may be beneath (i.e., coupled parallel with) or adjacent to the load on a silicon die, on an interposer (between die and package), on an existing silicon bridge (interconnecting two die), or embedded in the package or embedded in the interposer.

In some embodiments, in implementations including use of high-voltage transistors, such as gallium nitride (GaN), a voltage converter may be implemented to handle battery level input voltages (6 or 12 volts) or voltages as high as 12 volts from a main power supply in the computer to reduce conduction losses. The transistors can be fabricated using high-voltage GaN semiconductors, thick gate silicon, or other higher voltage semiconductor technologies. In some embodiments, high-voltage transistors may alternatively be included in an additional optional die with the microprocessor to reduce the total bill of materials on a motherboard.

In some embodiments, capacitors may be fabricated using 3D metal-insulator-metal (MIM) structures, two dimensional (2D) planar MIM structures, or both. In some embodiments, the 3D structures may be prepared using porous silicon, porous alumina, porous polyimide, porous polymers, other porous structures (such as 30-200 nm pore diameters), or a combination of 2D and 3D structures such as trench capacitors. 3D MIM structures include, but are not limited to, structures formed using atomic layer deposited (ALD) conductors (such as TiN) followed by a high-k dielectric and then a second conductor. To fill very high aspect ratios, a process such as stop-flow atomic layer deposition or electroplating may be implemented.

In some embodiments, capacitors are fabricated on an opposite side of a substrate as the inductors. In an example, porous silicon capacitors may be fabricated on a first side (such as on a backside) of a silicon die and high-voltage transistors, inductors, or both are fabricated on a second, opposite side of the silicon die (on the front side). This is illustrated in, for example, FIGS. 2 and 3. In some embodiments, to eliminate the need for through-silicon vias in the LC silicon substrate, the silicon substrate is be contacted from both sides of the substrate.

In some embodiments, capacitors may alternatively be fabricated on both sides of the silicon LC substrate. In some embodiments, the capacitors on a first side of the substrate have different characteristics than capacitors on a second, opposite side of the LC substrate. In some embodiments, inductors may be fabricated using magnetic materials and standard silicon processing technologies.

In some embodiments, to improve the properties of the inductors, porous silicon can be formed beneath the inductors during the same processes for forming porous silicon capacitors to reduce eddy currents that may form in the silicon substrate adjacent to the inductor.

Figure 2:
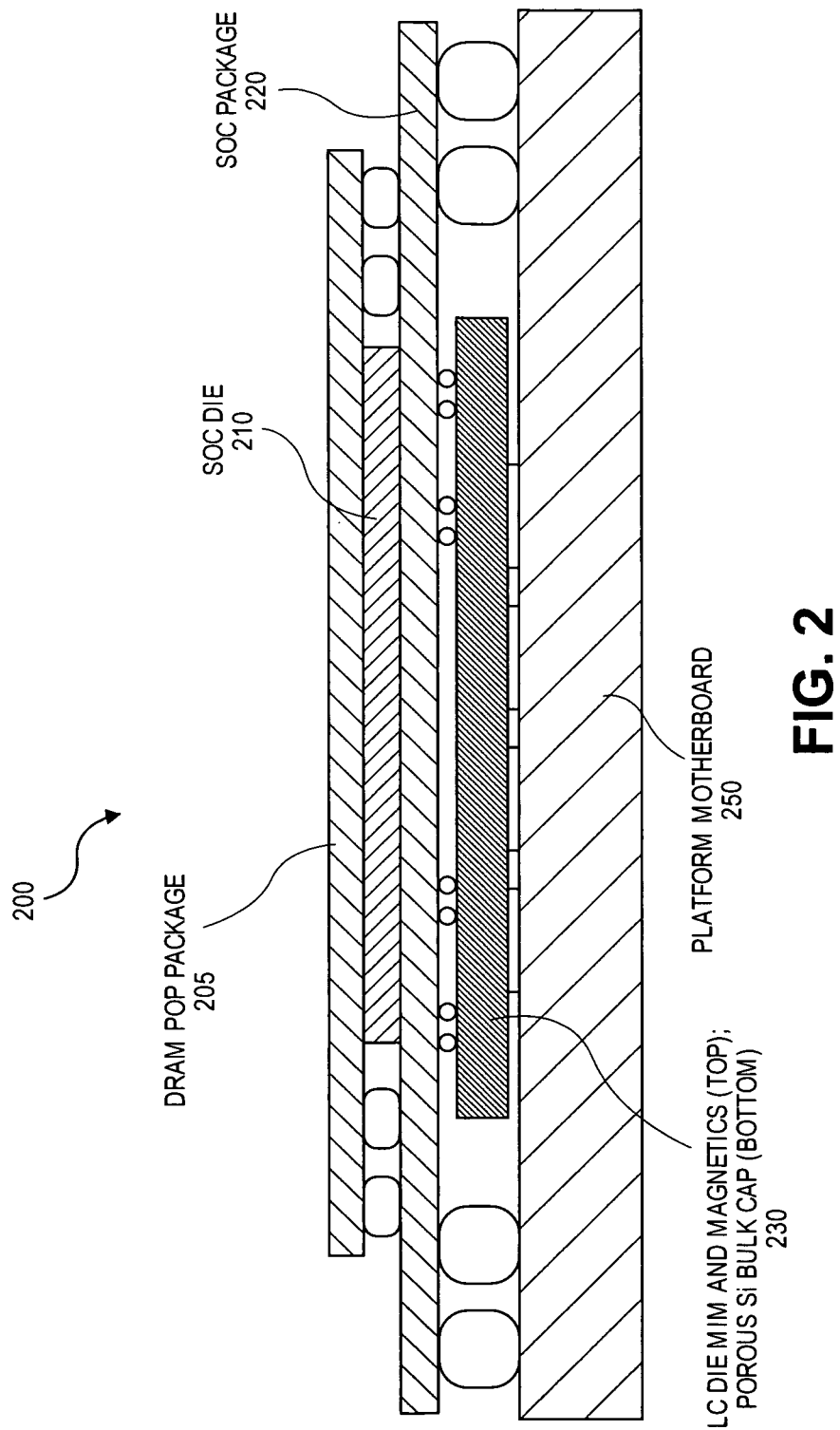
FIG. 2 is an illustration of apparatus with separate LC die according to an embodiment.

FIG. 2 is an illustration of apparatus with separate LC die according to an embodiment. As illustrated in FIG. 2, an apparatus 200 includes an SoC die 210 (or other semiconductor die) coupled with a package 220. In some embodiments, a separate silicon LC die 230 coupled with the package 220 includes certain capacitor and inductor structures. In some embodiments, the separate LC die 230, which has a smaller area than the package, is further coupled with a motherboard 250, wherein the SoC package is further coupled with the motherboard 250 by solder ball connections. Thus, in the illustrated implementation the LC die is coupled between the package 220 and the motherboard 250. As illustrated in FIG. 2, the apparatus 200 further includes a DRAM package on package (POP) construction, wherein a DRAM POP package 205 is coupled with the SOC package 220 with solder balls, the SOC die being coupled between the DRAM package 205 and the SOC package 220.

In some embodiments, the L-C die 230 is structured to include connections at a top and bottom of the die. In some embodiments, the LC die 230 includes MIM capacitors and inductors (with or without magnetic material) on a top side of the LC die 230, connected with the SoC package 230. In some embodiments, the LC die 230 includes capacitors that can be used for decoupling noise or other functions formed in a porous silicon surface on a bottom side of the LC die 230, as connected with the motherboard 250. In this embodiment, the motherboard 250 is used to connect to porous silicon capacitors from the bottom of the LC die 230, which saves on the need for through-silicon vias through the LC die. Further, the inductors and MIM capacitors needed for the output of integrated voltage regulators are on the top side of the LC die 230 near to the load.

Figure 3:
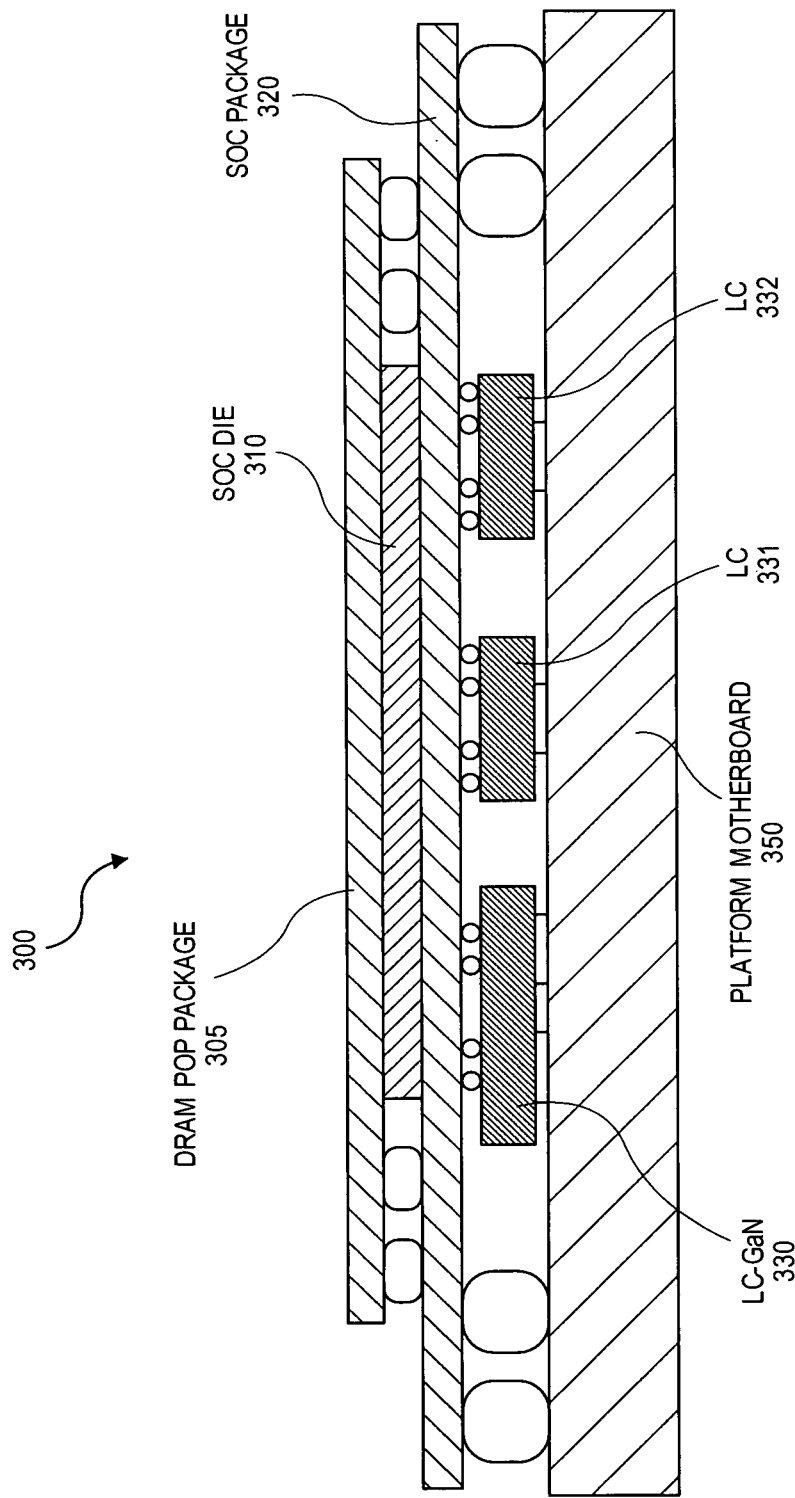
FIG. 3 is an illustration of apparatus with multiple separate LC dies according to an embodiment.

FIG. 3 is an illustration of apparatus with multiple separate LC dies according to an embodiment. As illustrated in FIG. 3, an apparatus 300 includes an SoC die 310 (or other semiconductor die) coupled with a package 320. In some embodiments, multiple LC dies 330-332 coupled with the package 320 includes certain capacitor and inductor structures. In some embodiments, a separate die may be positioned beneath different circuitry, such as processor cores or graphics cores as needed. In some embodiments, one die can consist of high voltage GaN transistors that can convert higher battery voltages. As illustrated in FIG. 3, a first LC die 330 includes certain capacitors, inductors, and high voltage (such as GaN) transistors, while the other dies 331-332 include inductors and capacitors. However, embodiments are not limited to these particular separate dies, and may include any combination of passive devices and transistors on the separate dies 330-332.

In some embodiments, the separate LC dies 330-332 are further coupled with a motherboard 350, wherein the SoC package 320 is further coupled with the motherboard 350 by solder ball connections. Thus, in the illustrated implementation the separate LC dies are coupled between the package 320 and the motherboard 350. As illustrated in FIG. 3, the apparatus 300 further includes a DRAM package on package (POP) construction, wherein a DRAM POP package 305 is coupled with the SOC package 332 with solder balls, the SOC die 310 being coupled between the DRAM package 305 and the SOC package 320.

In some embodiments, the multiple LC dies 330-332 are each structured to include connections at a top and bottom of the dies. In some embodiments, the LC dies 330-332 includes MIM capacitors and inductors (magnetics) on a top side of the dies 330-332, connected with the SoC package 320. In some embodiments, the LC dies 330-332 includes capacitors formed in a porous silicon surface on a bottom side of the dies 330-332, as connected with the motherboard 350.

Figure 4:
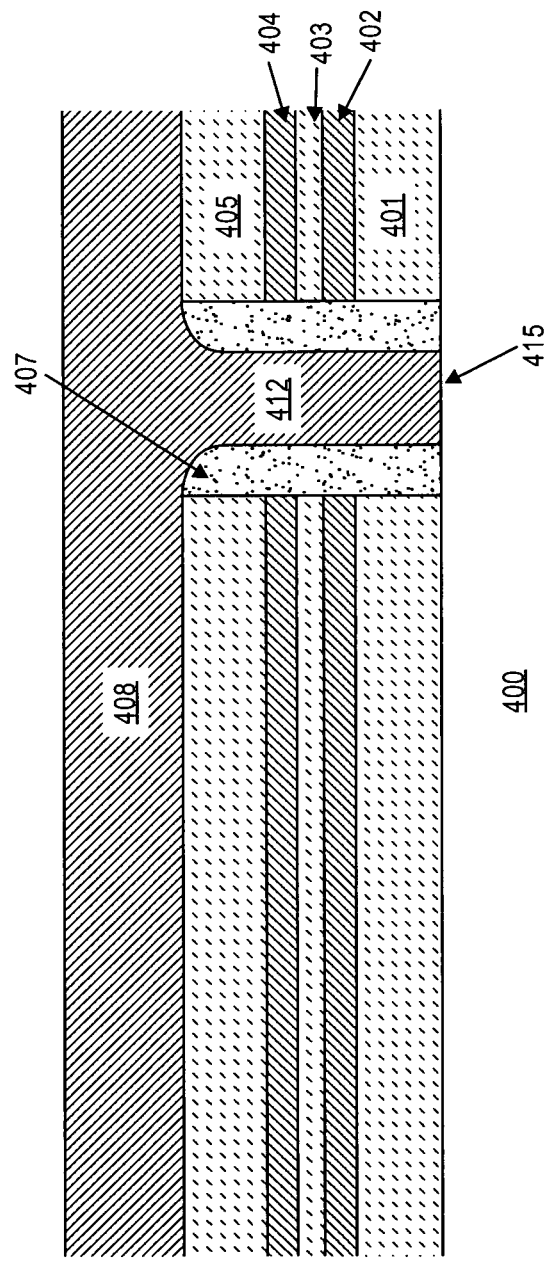
FIG. 4 is an illustration of a MIM capacitor used in a separate die according to an embodiment.

FIG. 4 is an illustration of a MIM capacitor used in a separate die according to an embodiment. FIG. 4 provides a cross-sectional illustration of an embedded decoupling capacitor (MIMcap), which is a capacitor in use, such as in certain core processors of Intel Corporation. In some embodiments, the MIMcap is on an LC die, such as, for example, LC die 230 in FIG. 2 or LC dies 330-332 in FIG. 3. As illustrated in FIG. 4, the structure of the capacitor includes substrate 400; insulative layer 401; conductive layer 402; high-dielectric constant dielectric layer 403; conductive layer 404; insulative layer 405; sidewall insulator 407; conductive layer 408; and via 412, wherein the via may in some instances expose a region 415, which is a previously formed metal layer.

Further details beyond the description of the current application are provided in U.S. Pat. No. 5,973,910 (Decoupling capacitor in an integrated circuit) and U.S. Pat. No. 6,027,980 (Method of Forming a Decoupling Capacitor).

Figure 5:
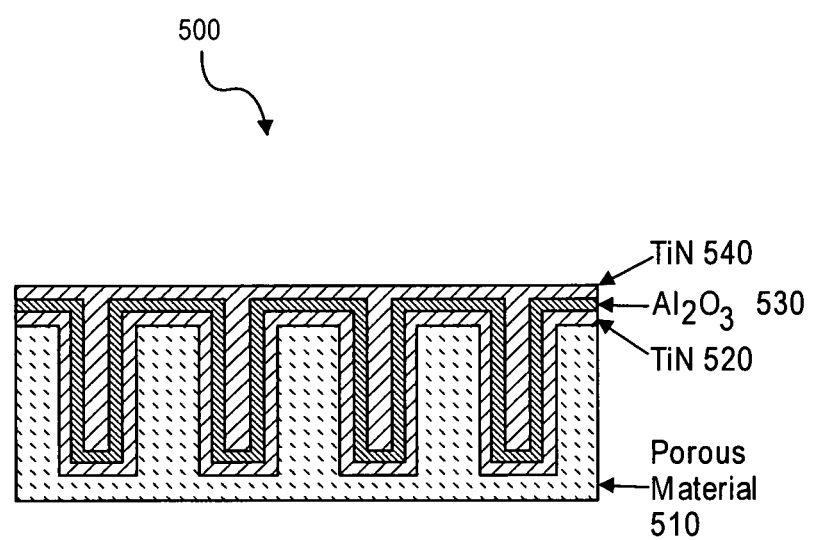
FIG. 5 is an illustration of 3D MIM structure used in a separate die according to an embodiment.

FIG. 5 is an illustration of 3D MIM structure used in a separate die according to an embodiment. FIG. 5 provides a cross-sectional illustration of a 3D MIM structure 500 that can be formed within high surface-area pores in silicon, alumna, a polyimide, a polymer, or other porous materials. In some embodiments, formed in the pores of the porous material 510 is a first layer of TiN (Titanium Nitride) 520; a dielectric layer of $Al_2O_3$ (Aluminum Oxide) 530; and a second layer of TiN 540.

In some embodiments, as part of the fabrication process, a mask can be formed using, for example, either LPCVD SiN, a Teflon-like polymer, or tungsten to form localized regions of pores for capacitors. Pores can be fabricated with different depths to provide capacitors with lower effective series resistance or higher capacitance.

In some embodiments, in order to improve the pore size uniformity, a pulsed anodization process can be used in place of a continuous potential where the potential is pulsed on and off to allow time for the etchant to diffuse into and out of the pores resulting in a more uniform pore size distribution.

FIGS. 6A-6E illustrate an example of a process for fabrication of a separate die including capacitor and inductor structures according to an embodiment. FIGS. 6A-6F illustrate a process flow for an LC die for forming two different MIM capacitor structures and an inductor structure with magnetic materials that can be used (optionally together with high voltage GaN transistors) for near load power delivery. In some embodiments, SiN (silicon nitride), a Teflon-like polymer, or a tungsten film is used as a mask to form localized regions of pores for capacitors.

Figure 6A:
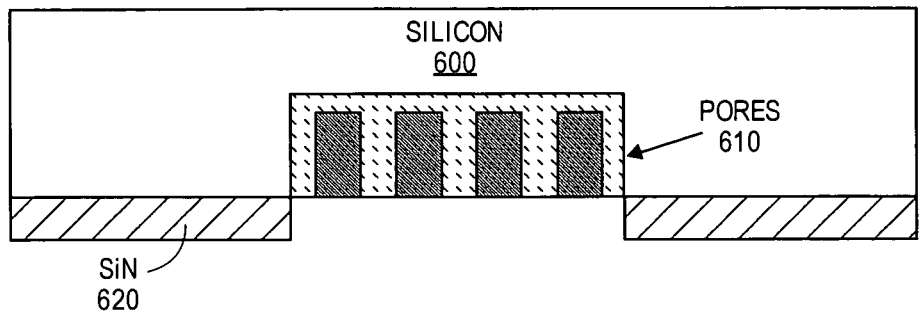
FIGS. 6A-6E illustrate an example of a process for fabrication of a separate die including capacitor and inductor structures according to an embodiment.

As provided in the illustrations:

FIG. 6A: Pores are present in porous silicon 600, wherein an SiN mask 620 forms a localized region of pores 610.

Figure 6B:
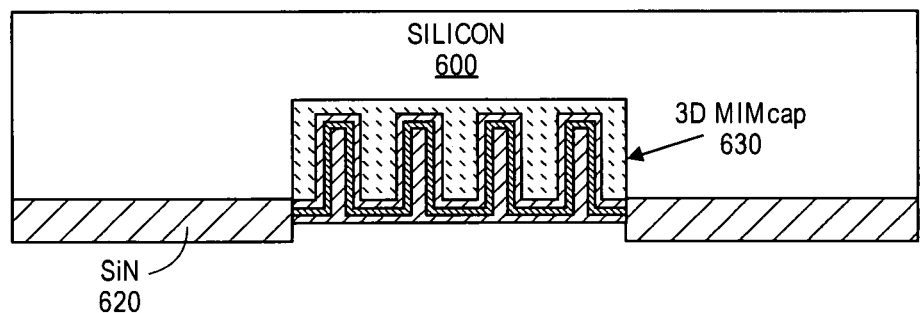

FIG. 6B: 3D MIM capacitors 630 are formed, such as illustrated in FIG. 5.

Figure 6C:
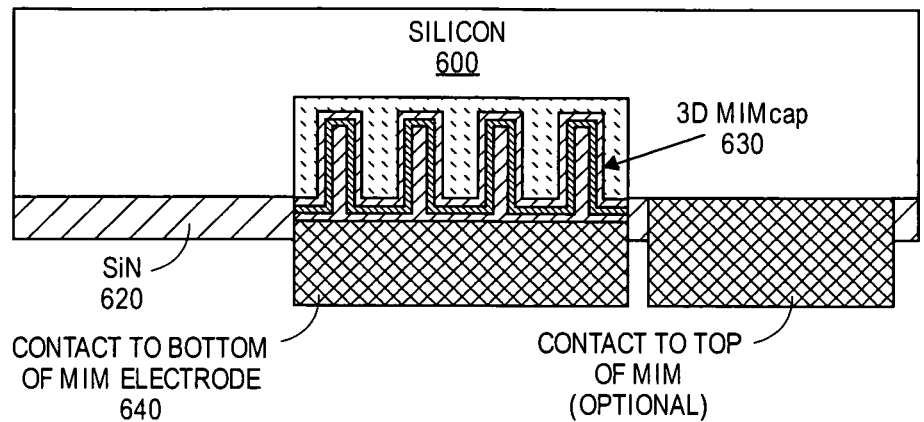

FIG. 6C: Contacts 640 to the bottom of the MIM capacitor electrodes 630 are formed to, for example, provide contact with a motherboard as illustrated in FIGS. 2 and 3. Contacts to the top of the MIM capacitors 630 may also be optionally formed.

Figure 6D:
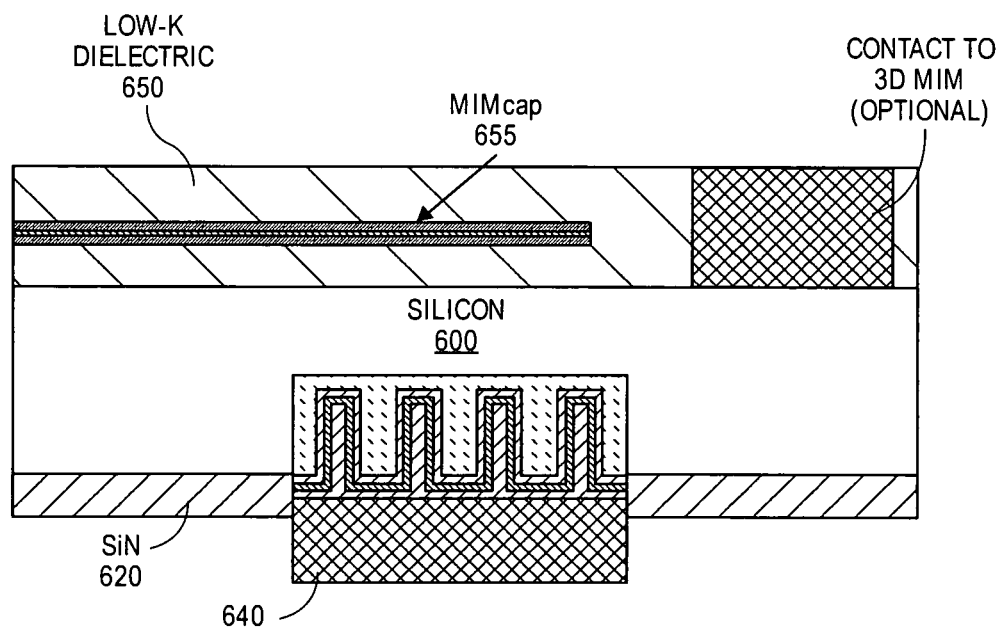

FIG. 6D: A dielectric 650 is applied to the top of the silicon 600, with 2D MIM capacitors 655 being formed in the dielectric 650. As illustrated, a contact to the 3D MIM capacitors may be optionally present.

Figure 6E:
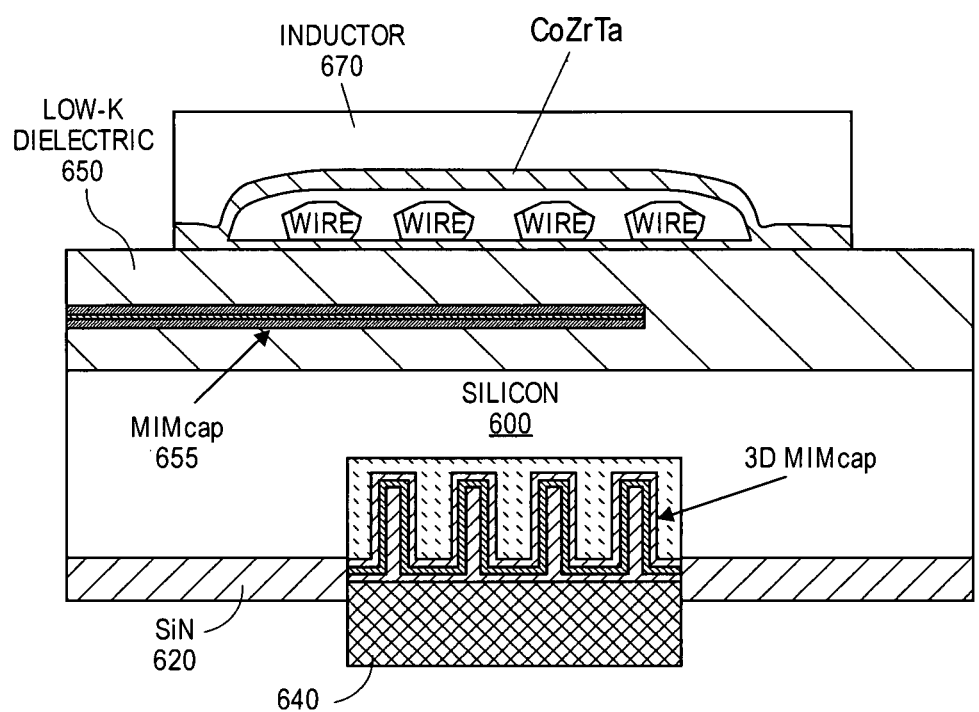

FIG. 6E: Inductors 670 are further formed, which may include the illustrated CoZrTa (Cobalt Zirconium Tantalum) magnetic materials surrounding the illustrated wire structure.

Figure 7:
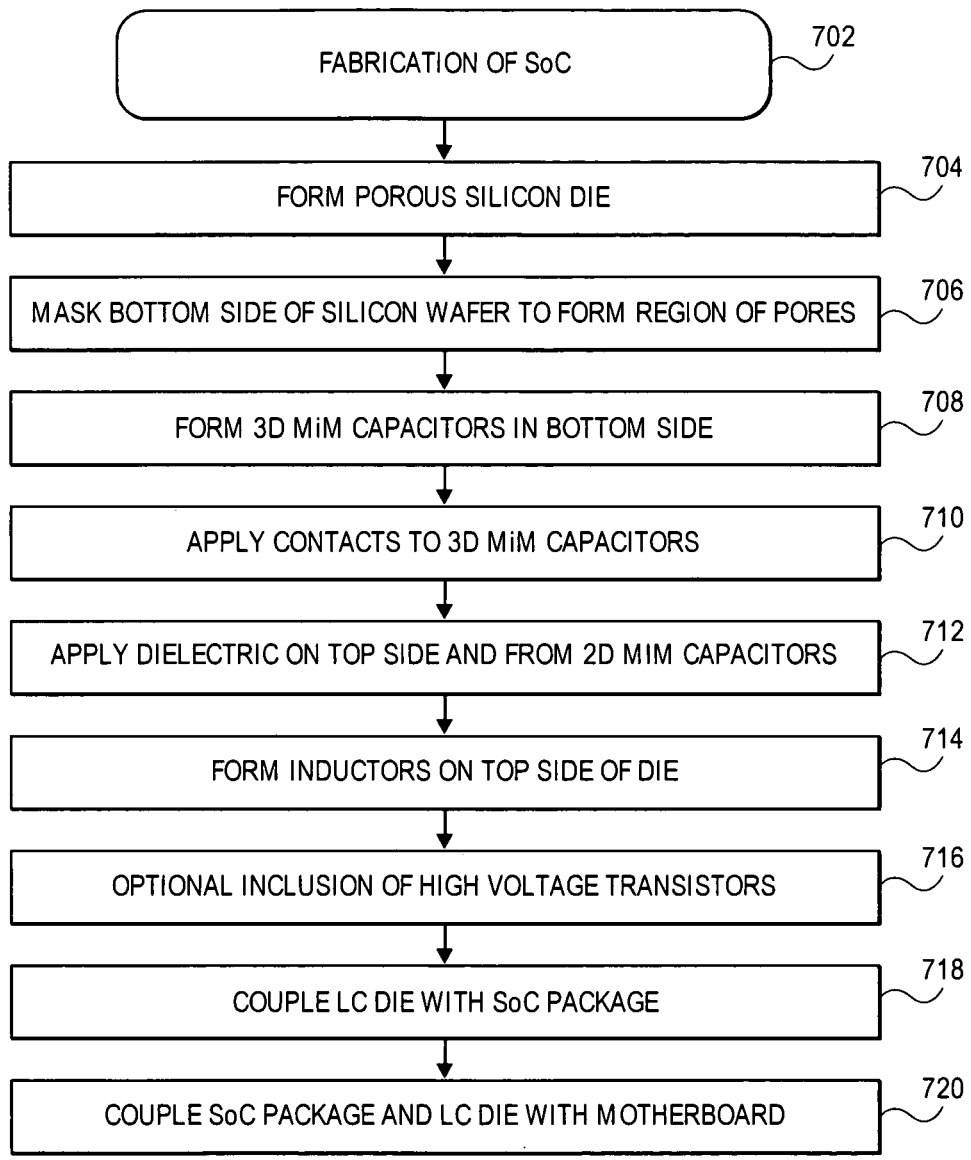
FIG. 7 is a flowchart to illustrate a process for fabrication of an apparatus according to an embodiment.

FIG. 7 is a flowchart to illustrate a process for fabrication of an apparatus according to an embodiment. Certain details are not provided in such process. In some embodiments, the element of the process may be performed in a different order or overlapping in time.

In some embodiments, a process for fabrication of an apparatus such as a system on chip 702 includes forming a porous silicon die 704, and masking the bottom side of the silicon wafer to form a region of pores 706 for the fabrication of capacitors. In some embodiments, 3D MIM capacitors are formed in the bottom side of the silicon die 708, such as illustrated in FIGS. 5 and 6B, and contacts are applied to the 3D MIM capacitors 710, such as illustrated in FIG. 6C.

In some embodiments, a dielectric is applied to a top side of the silicon die and 2D MIM capacitors are formed 712. In some embodiments, inductors are further formed on the top side of the separate die 714. In some embodiments, high voltage transistors (such as GaN transistors) may optionally be embedded in the separate die to separate such transistors from the main die 716.

In some embodiments, the process may then proceed with the fabrication of the apparatus, including the coupling of the separate LC die with the SoC package 718, and the coupling of the SoC package and LC die with the motherboard 720, wherein the separate LC die may contact both the SoC package and the motherboard.

Figure 8:
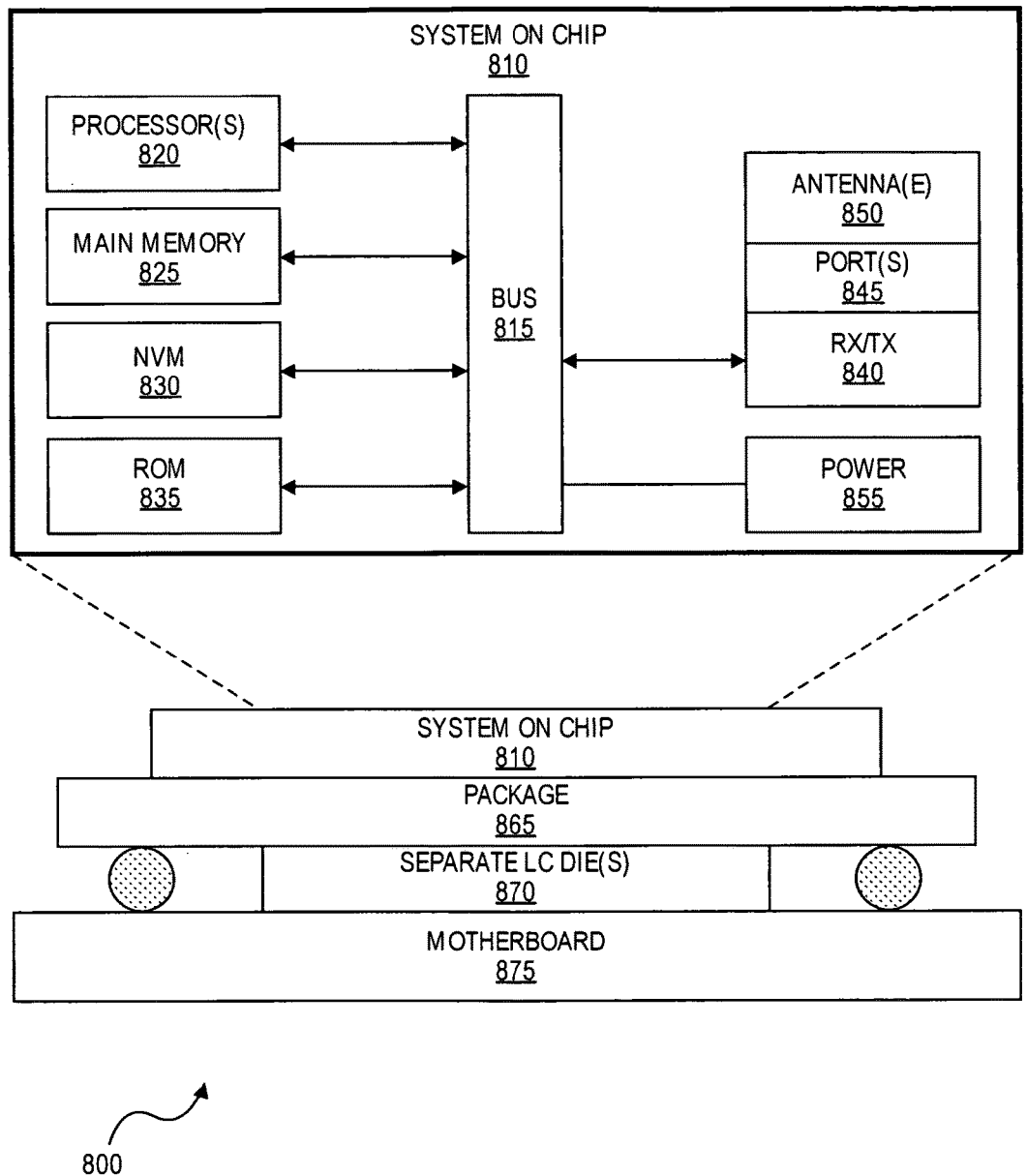
FIG. 8 is an illustration of an embodiment of an apparatus or system including a package with integrated passive components on chip according to an embodiment.

FIG. 8 is an illustration of an embodiment of an apparatus or system including a package with integrated passive components on chip according to an embodiment. In this illustration, certain standard and well-known components that are not germane to the present description are not shown.

In some embodiments, a system or apparatus 800 may include, but is not limited to, a semiconductor die such as a system on chip 810 coupled with a package 865. In some embodiments, one or more separate LC dies 870 are coupled to the package 865, wherein a motherboard 875 may further be coupled with the package 865 and the one or more LC dies 870, wherein the one or more LC dies may be coupled between the package 865 and the motherboard 875, and may contact both the package 865 and the motherboard 875. In some embodiments, the one or more separate LC dies 870 include passive components (in particular capacitors and inductors) for the system on chip. In some embodiments, the one or more LC dies may be embedded in the package 865.

In some embodiments, the system on chip 810 includes processing means such as one or more processors 820 coupled to one or more buses or interconnects, shown in general as bus 815. The processors 820 may comprise one or more physical processors and one or more logical processors. In some embodiments, the processors may include one or more general-purpose processors or special-processor processors. The bus 815 is a communication means for transmission of data. The bus 815 is illustrated as a single bus for simplicity, but may represent multiple different interconnects or buses and the component connections to such interconnects or buses may vary. The bus 815 shown in FIG. 8 is an abstraction that represents any one or more separate physical buses, point-to-point connections, or both connected by appropriate bridges, adapters, or controllers.

In some embodiments, the system on chip 810 further comprises a random access memory (RAM) or other dynamic storage device or element as a main memory 825 for storing information and instructions to be executed by the processors 820. Main memory 825 may include, but is not limited to, dynamic random access memory (DRAM).

The system on chip 810 also may comprise a non-volatile memory (NVM) 830; and a read only memory (ROM) 835 or other static storage device for storing static information and instructions for the processors 820.

In some embodiments, the system on chip 810 includes one or more transmitters or receivers 840 coupled to the bus 815 to provide wired or wireless communications. In some embodiments, the system on chip 810 may include one or more antennae 850, such as dipole or monopole antennae, for the transmission and reception of data via wireless communication using a wireless transmitter, receiver, or both, and one or more ports 845 for the transmission and reception of data via wired communications. Wireless communication includes, but is not limited to, Wi-Fi, Bluetooth™, near field communication, and other wireless communication standards.

In some embodiments, the system on chip 810 may also comprise power source 855, which may include a battery, solar cell, a fuel cell, a charged capacitor, near field inductive coupling, or other system or device for providing or generating power in the system on chip 810. The power provided by the power source 855 may be distributed as required to elements of the system on chip 810.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a device includes a semiconductor die; a semiconductor die package, a first side of the package being coupled with the semiconductor die; and one or more separate dies to provide a plurality of passive components for operation of the semiconductor die. In some embodiments, the plurality of passive components for operation of the semiconductor die includes a plurality of inductors.

In some embodiments, the one or more separate dies further include one or more high voltage transistors. In some embodiments, the one or more high voltage transistors includes one or more GaN (gallium nitride) transistors.

In some embodiments, the one or more separate dies are coupled with a second, opposite side of the package and are electrically connected with the semiconductor die through the package.

In some embodiments, the device further includes a motherboard, the one or more separate dies being coupled between the package and the motherboard, the package being connected to the motherboard by solder balls.

In some embodiments, further comprising an interposer between the semiconductor die and the semiconductor die package, wherein the one or more separate dies are embedded inside the interposer.

In some embodiments, the plurality of passive components for operation of the semiconductor die further includes a plurality of capacitors.

In some embodiments, a first separate die includes a first set of passive components on a first side of the first separate die and a second, different set of passive components on a second, opposite side of the first separate die.

In some embodiments, the first side of the first separate die includes a set of a first type of capacitor and a set of inductors, and the second side of the first separate die includes a set of a second type of capacitor.

In some embodiments, the first type of capacitor is a two dimensional planar capacitor.

In some embodiments, the first separate die includes a porous material, and wherein the second type of capacitor includes a three dimensional capacitor formed in the pores of the porous material.

In some embodiments, the three dimensional capacitor is a MIM (metal-insulator-metal) capacitor.

In some embodiments, the semiconductor die is system on chip (SoC).

In some embodiments, a method includes fabricating one or more separate dies, the one or more separate dies including a plurality of passive components; coupling a first side of a semiconductor die package with a semiconductor die; and coupling the one or more separate dies with the semiconductor die package to provide passive components for operation of the semiconductor die. In some embodiments, the plurality of passive components includes one or more inductors.

In some embodiments, the one or more separate dies further include one or more high voltage transistors.

In some embodiments, coupling the one or more separate dies with the semiconductor die package includes coupling the one or more separate dies with a second, opposite side of the package, and electrically connected the one or more separate dies with the semiconductor die through the package.

In some embodiments, the plurality of passive components further includes a plurality of capacitors.

In some embodiments, fabricating the one or more separate dies includes fabricating a first separate die with a first set of passive components on a first side of the first separate die and a second, different set of passive components on a second, opposite side of the first separate die.

In some embodiments, the first side of the first separate die includes a set of a first type of capacitor and a set of inductors, and the second side of the first separate die includes a set of a second type of capacitor.

In some embodiments, the first type of capacitor is a two dimensional planar capacitor.

In some embodiments, fabricating the one or more separate dies includes fabricating a porous material on the second side of the first separate die and fabricating a three dimensional capacitor in the pores of the porous material.

In some embodiments, fabricating the three dimensional capacitor includes fabricating one or more MIM (metal-insulator-metal) capacitors.

In some embodiments, a system includes a system on chip; a semiconductor die package, a first side of the package being coupled with the system on chip; one or more separate dies to provide a plurality of passive components for operation of the system on chip, a first side of each of the one or more separate dies being coupled to a second, opposite side of semiconductor die package; a mother board, the motherboard being coupled with the second side of the semiconductor die package and a second, opposite side of each of the one or more separate dies, the one or more separate dies being between the semiconductor die package and the motherboard. In some embodiments, the plurality of passive components includes a plurality of inductors.

In some embodiments, the one or more separate dies further include one or more high voltage transistors.

In some embodiments, the plurality of passive components further includes a plurality of capacitors.

What is claimed is:

1. A device comprising:
    a semiconductor die;
    a semiconductor die package, a first side of the package being coupled with the semiconductor die; and
    one or more separate dies to provide a plurality of passive components for operation of the semiconductor die, wherein the plurality of passive components for operation of the semiconductor die includes a plurality of inductors and a plurality of capacitors, and wherein a first separate die includes a first set of passive components on a first side of the first separate die and a second, different set of passive components on a second, opposite side of the first separate die.

2. The device of claim 1, wherein the one or more separate dies further include one or more high voltage transistors.

3. The device of claim 2, wherein the one or more high voltage transistors includes one or more GaN (gallium nitride) transistors.

4. The device of claim 1, wherein the one or more separate dies are coupled with a second, opposite side of the package and are electrically connected with the semiconductor die through the package.

5. The device of claim 4, further comprising a motherboard, the one or more separate dies being coupled between the package and the motherboard, the package being connected to the motherboard by solder balls.

6. The device of claim 1, further comprising an interposer between the semiconductor die and the semiconductor die package, wherein the one or more separate dies are embedded inside the interposer.

7. The device of claim 1, wherein the first side of the first separate die includes a set of a first type of capacitor and a set of inductors, and the second side of the first separate die includes a set of a second type of capacitor.

8. The device of claim 7, wherein the first type of capacitor is a two dimensional planar capacitor.

9. The device of claim 7, wherein the first separate die includes a porous material, and wherein the second type of capacitor includes a three dimensional capacitor formed in the pores of the porous material.

10. The device of claim 9, wherein the three dimensional capacitor is a MIM (metal-insulator-metal) capacitor.

11. The device of claim 1, wherein the semiconductor die is system on chip (SoC).

12. A method comprising:
    fabricating one or more separate dies, the one or more separate dies including a plurality of passive components;
    coupling a first side of a semiconductor die package with a semiconductor die; and
    coupling the one or more separate dies with the semiconductor die package to provide passive components for operation of the semiconductor die;
    wherein the plurality of passive components includes one or more inductors and a plurality of capacitors; and
    wherein fabricating the one or more separate dies includes fabricating a first separate die with a first set of passive components on a first side of the first separate die and a second, different set of passive components on a second, opposite side of the first separate die.

13. The method of claim 12, wherein the one or more separate dies further include one or more high voltage transistors.

14. The method of claim 12, wherein coupling the one or more separate dies with the semiconductor die package includes coupling the one or more separate dies with a second, opposite side of the package, and electrically connected the one or more separate dies with the semiconductor die through the package.

15. The method of claim 12, wherein the first side of the first separate die includes a set of a first type of capacitor and a set of inductors, and the second side of the first separate die includes a set of a second type of capacitor.

16. The method of claim 15, wherein the first type of capacitor is a two dimensional planar capacitor.

17. The method of claim 15, wherein fabricating the one or more separate dies includes fabricating a porous material on the second side of the first separate die and fabricating a three dimensional capacitor in the pores of the porous material.

18. The method of claim 17, wherein fabricating the three dimensional capacitor includes fabricating one or more MIM (metal-insulator-metal) capacitors.

19. A system comprising:
a system on chip;
a semiconductor die package, a first side of the package being coupled with the system on chip;
one or more separate dies to provide a plurality of passive components for operation of the system on chip, a first side of each of the one or more separate dies being coupled to a second, opposite side of semiconductor die package;
a mother board, the motherboard being coupled with the second side of the semiconductor die package and a second, opposite side of each of the one or more separate dies, the one or more separate dies being between the semiconductor die package and the motherboard;
wherein the plurality of passive components includes a plurality of inductors, wherein the one or more separate dies further include one or more high voltage transistors.

20. The system of claim 19, the plurality of passive components further includes a plurality of capacitors.

21. A device comprising:
a semiconductor die;
a semiconductor die package, a first side of the package being coupled with the semiconductor die; and
one or more separate dies to provide a plurality of passive components for operation of the semiconductor die, wherein the one or more separate dies further include one or more high voltage transistors, and wherein the plurality of passive components for operation of the semiconductor die includes a plurality of inductors.

22. The device of claim 21, wherein the one or more high voltage transistors includes one or more GaN (gallium nitride) transistors.

23. A device comprising:
a semiconductor die;
a semiconductor die package, a first side of the package being coupled with the semiconductor die;
one or more separate dies to provide a plurality of passive components for operation of the semiconductor die, wherein the plurality of passive components for operation of the semiconductor die includes a plurality of inductors; and
an interposer between the semiconductor die and the semiconductor die package, wherein the one or more separate dies are embedded inside the interposer.

24. A method comprising:
fabricating one or more separate dies, the one or more separate dies including a plurality of passive components;
coupling a first side of a semiconductor die package with a semiconductor die; and
coupling the one or more separate dies with the semiconductor die package to provide passive components for operation of the semiconductor die, wherein the one or more separate dies further include one or more high voltage transistors, and wherein the plurality of passive components includes one or more inductors.

* * * * *